(12) United States Patent
Wong

(10) Patent No.: US 6,211,050 B1
(45) Date of Patent: Apr. 3, 2001

(54) FILL PATTERN IN KERF AREAS TO PREVENT LOCALIZED NON-UNIFORMITIES OF INSULATING LAYERS AT DIE CORNERS ON SEMICONDUCTOR SUBSTRATES

(75) Inventor: George Wong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/261,681

(22) Filed: Mar. 3, 1999

(51) Int. Cl.[7] .................................................. H01L 21/44
(52) U.S. Cl. .............................. 438/597; 438/598; 716/19
(58) Field of Search .............................. 716/19; 257/635; 438/597, 598, 599

(56) References Cited

U.S. PATENT DOCUMENTS

| | | | |
|---|---|---|---|
| 4,916,514 | * 4/1990 | Nowak | 257/758 |
| 5,166,101 | * 11/1992 | Lee et al. | 438/763 |
| 5,441,915 | * 8/1995 | Lee | 438/631 |
| 5,589,706 | 12/1996 | Mitwalsky et al. | 257/529 |
| 5,618,757 | 4/1997 | Bothra et al. | 438/699 |
| 5,663,599 | 9/1997 | Lur | 257/750 |
| 5,733,798 | 3/1998 | Michael et al. | 437/195 |
| 5,763,936 | 6/1998 | Yamaha et al. | 257/644 |
| 5,763,955 | 6/1998 | Findley et al. | 257/775 |
| 5,861,342 | * 1/1999 | Gabriel et al. | 438/631 |
| 5,928,959 | * 7/1999 | Huckels et al. | 438/691 |
| 6,020,265 | * 2/2000 | Lou | 438/692 |
| 6,037,251 | * 3/2000 | Tu et al. | 438/626 |

\* cited by examiner

*Primary Examiner*—Vu A. Le
*Assistant Examiner*—Christian D. Wilson
(74) *Attorney, Agent, or Firm*—George O. Saile; Rosemary L. S. Pike

(57) ABSTRACT

A method for making a planar spin-on-glass (SOG) layer over integrated circuits at the corners of the chip (die) areas is achieved. This method allows more reliable integrated circuits to be made, and is particularly useful for liquid crystal displays (LCDs) by eliminating optical distortion at the corners of the LCD die areas. When a conducting layer is patterned to form portions of the integrated circuits over the chip areas, the layer is concurrently patterned to form a fill layer in the kerf areas. The spacing between the fill layer in the kerf areas and the edges of the patterned conducting layer in the die areas is selected to have a width sufficiently narrow to provide a uniform coating of SOG over the corners of the die areas without buildup of the SOG. After depositing a thin $SiO_x$ cap layer, a uniform SOG layer is deposited. The fill layer in the kerf areas also prevents dishing of the SOG layer when the SOG is chem-mech polished back. The process steps of this invention can be repeated to provide multilevels of electrical interconnections as required to complete the integrated circuits without causing non-uniformity of the SOG at the die corners.

17 Claims, 4 Drawing Sheets

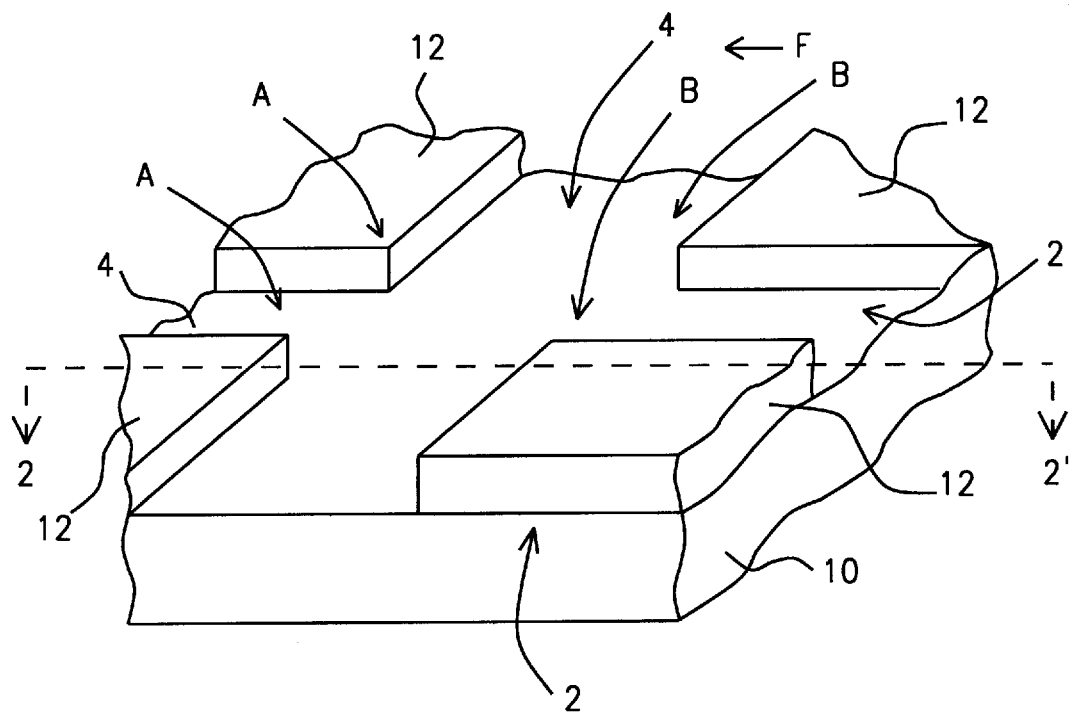
*FIG. 1 - Prior Art*
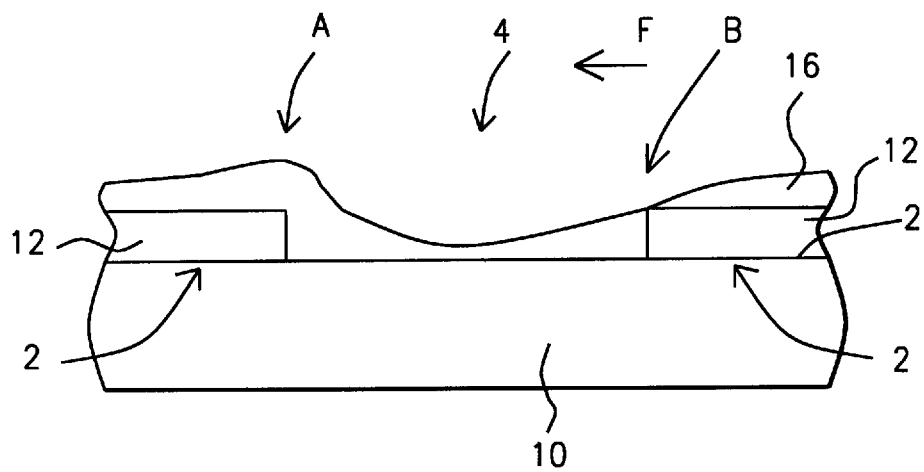
*FIG. 2 - Prior Art*

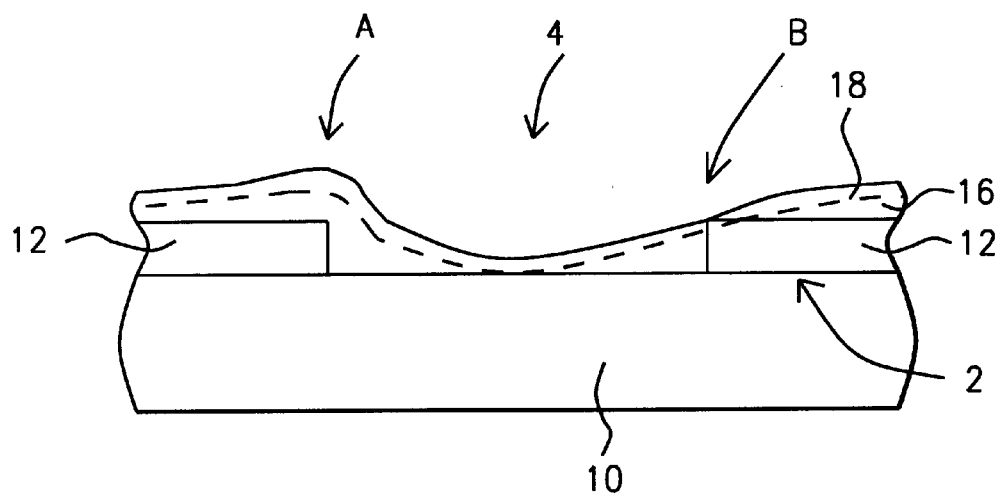
*FIG. 3 - Prior Art*
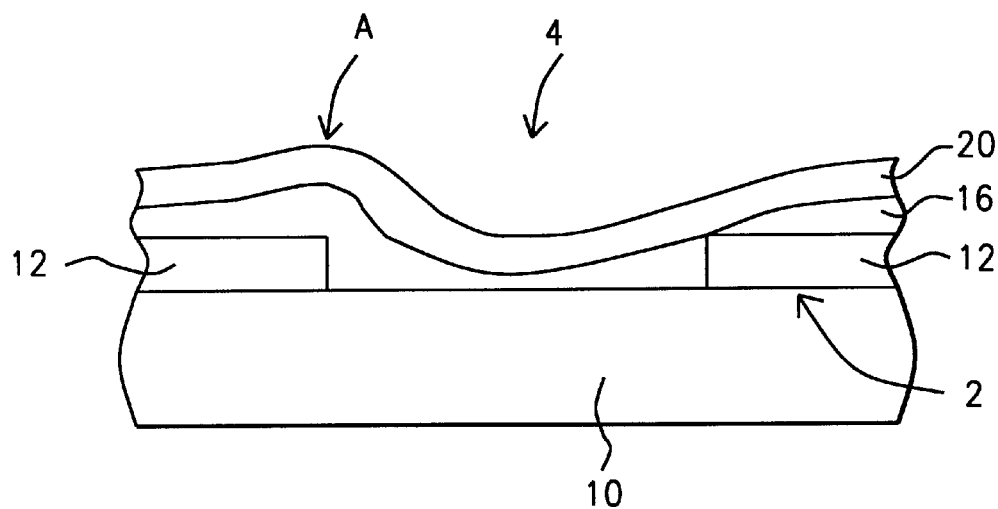
*FIG. 4 - Prior Art*

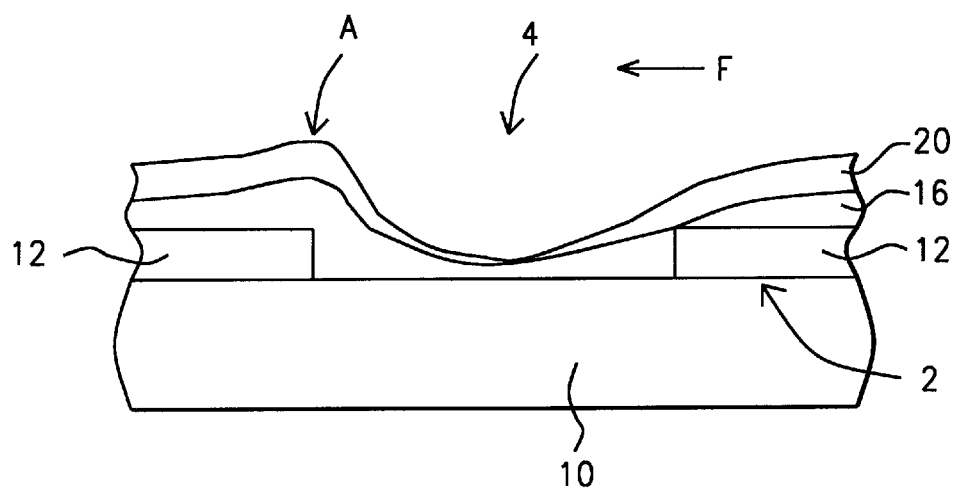
FIG. 5 – Prior Art
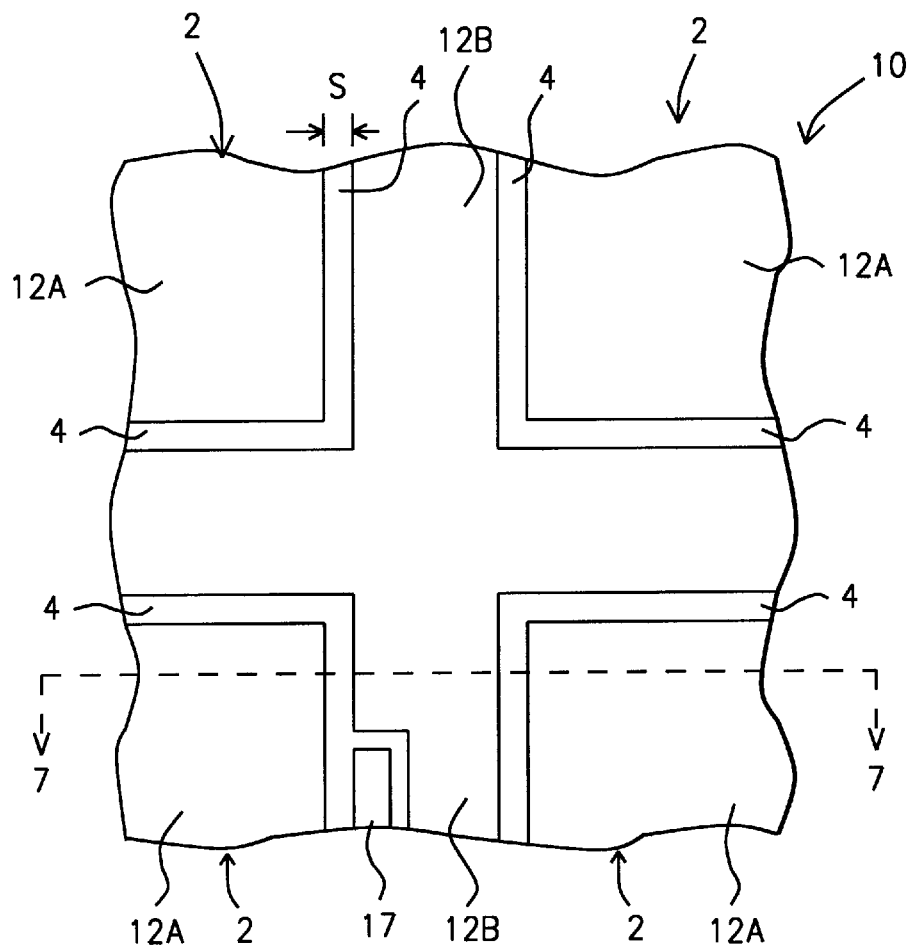
FIG. 6

FILL PATTERN IN KERF AREAS TO PREVENT LOCALIZED NON-UNIFORMITIES OF INSULATING LAYERS AT DIE CORNERS ON SEMICONDUCTOR SUBSTRATES

BACKGROUND OF THE INVENTION (1) Field of the Invention

The present invention relates to a method for fabricating integrated circuits. More particularly, the method utilizes patterned semiconductor layers, such as polycide and metal, to fill kerf (scribe) areas between chip sites (die) to prevent non-uniform insulating layers at the die corners during spin-on-glass (SOG) coating. The method and structure also prevent dishing during chemical-mechanical polishing of the SOG. The electrically conducting semiconductor (polycide and metal) layers that are patterned to make the integrated circuits are also patterned to provide the fill material in the kerf area, and therefore additional masking steps are not required.

(2) Description of the Prior Art

The integrated circuit density on ultra-large scale integrated (ULSI) circuits has dramatically increased due to advances in semiconductor processing, such as the use of high-resolution photolithography and anisotropic plasma etching. Therefore, the design rules are more aggressively scaled down, and in addition more levels of metal are added to effectively interconnect the high density of discrete devices on the chip. The patterned conducting layers are typically separated by insulating layers in which via holes are etched to interconnect the various levels of conducting (polysilicon and metal) interconnections.

To achieve this high circuit density in the die areas, it is necessary to use planar insulating layers. This allows distortion-free photoresist mask images to be formed on the planar surface with resolution and fidelity. Also the planar surface allows the conducting layers to be patterned by directional etching (e.g., anisotropic plasma etching) without leaving conducting layer residue in recesses that can cause intrametal electrical shorts on an otherwise non-planar surface.

One method for making planar insulating surfaces that is finding widespread use in the semiconductor industry is to deposit a spin-on glass (SOG) in liquid form by spin coating. The SOG is then baked and cured to form an inorganic silicon oxide ($SiO_2$) layer that is then etched back or chemically-mechanically polished back. Generally, when the SOG is applied by spin coating, the layer is higher over closely spaced conducting lines than over areas with fewer metal lines. Therefore, the SOG is not completely planar. Also, when chemical-mechanical polishing (CMP) is used to polish back the SOG, the SOG over the area with the lower density of lines tends to polish back faster, resulting in recessing, and commonly referred to as a "dishing effect."

One method of circumventing this non-uniform SOG problem on integrated circuits is described in U.S. Pat. No. 5,733,798 to Michael et al. The method utilizes non-operational conductors spaced at a minimum distance from each other to form a regular spaced arrangement of conductors in the die areas for integrated circuits. This allows the insulating layer over the patterned conductors to be polished back without dishing. Another method is described in U.S. Pat. No. 5,763,955 to Findley et al., in which polygon-shaped, metal-fill segments (dummy lines) are used to fill the spaces between the functional metal lines on the die areas for the integrated circuit to allow for global planarization on each of the die areas across the substrate. Bothra et al. in U.S. Pat. No. 5,618,757 describe a method in which dummy raised areas are formed in the gaps between the active conductive metal lines (traces). The dummy raised areas can be formed from the same metal layer used to form the conductive lines. This allows the SOG to be etched back to provide a planar surface.

When metal lines are spaced closely together (less than 1 micrometer) keyhole-type tunnels are formed unavoidably in the insulating layer over the metal lines. During processing, photoresist can be trapped in these tunnels at the end of the lines. Lur in U.S. Pat. No. 5,663,599 teaches a method of forming dummy metal lines at the end of the functional metal lines. This eliminates the keyhole in the insulating layer between the functional metal lines that would otherwise trap the photoresist during subsequent masking steps. Also, Lur teaches a method of forming partial via holes in which the metal lines terminate. This reduces the aspect ratio of the metal lines which eliminates the keyhole tunnel at the end of the metal lines. Mitwalsky et al. in U.S. Pat. No. 5,589,706 describe a method of making reliable fuse-link structures with vertical sidewalls by using dummy structures adjacent to the fuse, but the dummy structures do not form part of the fuse structure. Yamaha et al., U.S. Pat. No. 5,763,936, teach a method of reducing cracking in a thick spin-on-glass film which is used to hermetically seal the chip. The method involves forming dummy wiring patterns to thin the spin-on glass, thereby reducing stress in the spin-on glass.

However, another problem that is not addressed by the above references is the formation of non-uniform build-up of the SOG at the die (chip) area corners when spin-on glass (SOG) is applied by spin coating. This problem, commonly referred to as streaking, is best illustrated by referring to the prior art FIGS. 1 through 5. Typically an array of die (chip) areas are formed in which the integrated circuits are fabricated, separated by kerf or scribe areas. During processing, the kerf areas typically have test structures for inline testing, alignment marks, and the like. After the integrated circuits are completed, the substrate is diced through the kerf areas to separate the individual chips for packaging.

Referring to FIG. 1, a schematic three-dimensional aerial view is shown of a portion of a substrate 10 at the corners of four die areas 2. During fabrication an electrically conducting layer 12 (such as polysilicon or metal) is deposited and patterned to form the integrated circuits (ICs) in the die areas 2. To simplify the drawing and discussion, the detailed patterning of layer 12 to make the integrate circuits is not shown; only the edge of the patterned conducting layer 12 at the die edges is depicted. The patterned conducting layer is shown in FIG. 1 prior to depositing a spin-on glass by spin coating. The array of die areas in which the integrated circuits are fabricated are separated by kerf areas (also called scribe areas) 4.

To better appreciate the problem, a schematic cross-sectional view is shown in FIG. 2, through 2-2' of FIG. 1. The cross section is shown through the kerf area 4 and through the patterned conducting layer 12 on die areas 2 and near the die corners A and B, respectively, after spin coating a spin-on-glass layer 16. When the SOG 16 is dispensed on the rotating wafer, the result is a non-uniform layer that appears as streaking of the SOG at the corner A. As shown in FIG. 2, this SOG non-uniformity or streaking results in a thicker SOG at the die corner A, while the SOG is thinner at the corner B of the adjacent die. This non-uniformity results from the nature of the spin coating in which the directional flow F of the SOG is radially outward from the axis of rotation of the wafer due to the centrifuging effect. The SOG 16 is then baked and cured to reduce solvents and to form an essentially silicon oxide ($SiO_x$) layer. As shown in prior-art FIG. 3, when this cured SOG layer 16 is etched back, the profile of the SOG layer, shown by the dashed line 18, remains essentially unchanged, replicating the thicker portion (streaking) over corner A. However, overetching of the thinner SOG over the die area at corner B can result in damage to the patterned conducting layer 12 at the die edge.

Typically after spin coating and etching back the SOG, a conformal encapsulating layer (cap oxide layer) 20, such as a chemical-vapor-deposited (CVD) silicon oxide, is deposited to seal the SOG layer. However, after the CVD oxide layer 20 is deposited, as shown in FIG. 4, and chemically-mechanically polished back, as shown in FIG. 5, dishing generally occurs in the kerf area 4 between the die areas 2, while the non-uniformity in the insulating layers 16 and 20 remains over the corner A of the die area.

Although FIGS. 1 and 5 depict the non-uniformity problem for a single conducting layer 12 on the die area 2, typically multiple levels of conducting layers, such as polysilicon, polycide, metal layers, and the like are used to complete the fabrication of the integrated circuit. This multilevel structure increases the elevation over the corner of the die area. When more than one conducting layer is used with interposed SOG layers, the subsequent elevation at the die corners increases, and it becomes more difficult to spin coat additional uniform SOG layers without streaks at the corners, such as corner A in FIG. 4.

While this non-uniformity is generally a problem in making reliable integrated circuits, it is a particular concern when making liquid crystal displays (LCDs) on substrates. For example, on active matrix liquid crystal displays (AMLCDs), after forming thin-film transistors (TFTs) and/or drive circuits, the multilayers of polysilicon, metal, and SOG can result in streaking or non-uniformities at the corners of the LCD die areas. These non-uniformities can distort the optical image from the pixel electrodes near the corners of the LCD die when the liquid crystal is sealed with a glass plate over the pixel electrodes on the substrate. The non-uniformity problem is further exacerbated on LCDs since the width of the kerf areas for LCD technologies is 300–600 micrometers (um), which is substantially greater than the 120 um wide kerf areas used for more conventional integrated circuits.

There is still a need in the semiconductor industry to provide an improved process for making uniform spin-on-glass layers near the edges, and more specifically near the corners of the die areas, for integrated circuits and LCDs.

SUMMARY OF THE INVENTION

It is therefore a principal object of this invention to provide a fill pattern in the kerf areas and at the corners of the die areas to facilitate the uniform deposition of a spin-on glass that would otherwise build up at the die corners.

Another object of this invention is to utilize the fill pattern to prevent dishing (non-uniform polishing) in the kerf area during chemical-mechanical polishing (CMP) of the spin-on glass.

Still another object of this invention is to provide the patterned fill in the kerf area without increasing the number of photoresist masking steps, and therefore provide a cost-effective manufacturing process.

The problem of a non-uniform spin-on-glass layer at the corners of the die areas and the dishing of the spin-on-glass layer in the kerf areas, during chemical-mechanical polishing, is solved by an improved process which includes a patterned fill layer in the kerf areas near the die corners.

The method of forming a uniform spin-on-glass (SOG) layer at the edge of the die areas is achieved on a semiconductor substrate having an array of die areas with semiconductor devices separated by kerf areas. A conducting layer is deposited on the substrate and patterned to form portions of the semiconductor devices in the die areas and, concurrently patterned to form a patterned fill layer in the kerf areas at the corners of the die areas. A spin-on-glass layer, consisting of one of the silicon-oxide (Si—O) network polymers dissolved in an organic solvent, is deposited on the substrate by spin coating. The patterned conducting fill layer in the kerf areas, formed prior to depositing the SOG layer, results in a uniform coating of the SOG over the corners of the array of die areas without buildup (streaking) of the spin-on-glass. Typically the space between the patterned conducting layer at the edge of the die and the patterned fill layer in the kerf area is about 2 um or less. The spin-on-glass layer is then baked to drive off the solvents, and cured to form an essentially $SiO_x$ layer. The SOG layer can then be chemically-mechanically polished back to form a planar surface. The underlying fill layer also prevents dishing of the spin-on glass in the kerf areas when the SOG is CMPed back. A cap insulating layer, such as a CVD oxide, is deposited on the spin-on-glass layer to complete the insulation for the conducting layer. The process steps can be repeated for each additional patterned conducting layer used in the process to complete the integrated circuit. The patterned fill layer in the kerf areas is utilized at each subsequent layer to provide a uniform SOG layer at the corners of the die areas.

Although the method is generally applicable to making semiconductor integrated circuits, it is particularly useful for making liquid crystal displays (LCD)s. The planar insulating layer at the edge of the LCD die areas prevents optical distortion from the pixels at the edge of the die area.

BRIEF DESCRIPTION OF THE DRAWINGS

The objects and other advantages of this invention are best understood with reference to the preferred embodiment when read in conjunction with the following drawings.

FIG. 1 shows a three-dimensional aerial view of a typical substrate having a raised patterned conducting layer at the corner of die areas, separated by kerf areas, prior to depositing a spin-on-glass (SOG).

FIG. 2 is a schematic cross-sectional view through the area 2-2' of FIG. 1 of the prior art after the SOG is deposited, depicting the elevated portions (streaking) of the SOG at the die edge, and the non-uniformity across the kerf area.

FIG. 3 shows a prior-art schematic cross-sectional view of the spin-on-glass profile in FIG. 2 after the SOG is etched back.

FIG. 4 is a prior-art schematic cross-sectional view of a substrate depicting the profile of the SOG after depositing a cap (encapsulating) insulating layer.

FIG. 5 is a prior-art schematic cross-sectional view of a substrate depicting the profile of the SOG after depositing the cap insulating layer and polishing back, resulting in dishing of the cap insulating layer in the kerf area.

FIG. 6 shows a schematic top view of a substrate at the corners of raised die areas, separated by kerf areas that have a patterned fill layer, by the method of this invention, prior to depositing a spin-on glass (SOG).

DESCRIPTION OF THE PREFERRED EMBODIMENT

Figure 7:
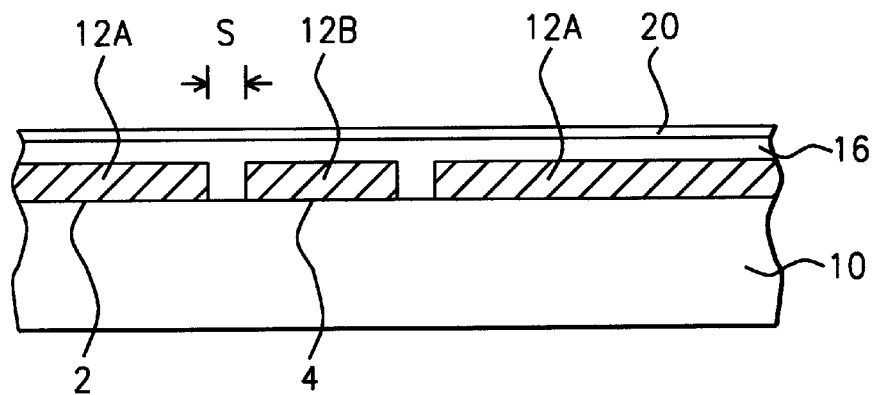
FIG. 7 shows a schematic cross-sectional view through the area 7-7' of FIG. 6 depicting a planar SOG layer over the corners of the die areas and over the kerf area resulting from the patterned fill layer, by the method of this invention.

The present invention relates to a method for forming planar insulating layers, composed of SOG, over patterned conducting layers, and more specifically for making planar insulating layers over the corners of the chip (die) areas on a semiconductor substrate. The method involves using a patterned fill layer in the kerf areas to prevent non-uniform buildup of a spin-on glass (SOG) at the die corners. Although the method is generally applicable for making semiconductor integrated circuits, it is particularly useful for making liquid crystal displays (LCDs). The planar insulating layer at the edge of the LCD die areas, formed by this method, prevents optical distortion from the pixels at the edge of the die areas when the LCD is sealed over the pixel electrodes.

Referring now to FIG. 6, a schematic top view of a portion of a substrate 10 is shown at the corners of four die areas 2 separated by a kerf area 4. Typically the substrate is a semiconductor material such as single crystal silicon, and has partially completed structures for integrated circuits, for example, having field oxide regions and gate oxides for FETs. If liquid crystal displays (LCDs) are being fabricated, then a glass substrate can also be used. The semiconductor devices, such as field effect transistors (FETs), thin-film transistors (TFTs), and the like, are formed in chip (die) areas 2. Electrically conducting layers, such as doped polysilicon, and/or polycide layers, are then patterned to form portions of the semiconductor devices in the die areas. One of these conducting layers 12A is shown in FIG. 6 over the die areas 2 to form portions of the semiconductor devices. The patterning of layer 12 is not explicitly shown to simplify the drawing and discussion. Only the patterned edge of the conducting layer 12A, relevant for this invention, is shown along the kerf areas 4 that separate the die areas 2. By the method of this invention, the conducting layer is also patterned at the same time to form a fill layer 12B in the kerf areas 4. The kerf areas 4 also include areas, such as area 17, in which test structures are made for inline process monitoring. Areas 17 also include the alignment marks for aligning the various mask levels used to pattern the conducting layers.

Referring now to FIG. 7, the method is described in detail for making improved planar SOG layers over conducting layers 12A at the corners of the chip (die) areas on a substrate 10. For integrated circuits, the substrate 10 is typically a doped single-crystal silicon. However, for LCDs the substrate can also be composed of glass. Next an electrically conducting layer is deposited on the substrate 10 to form portions 12A for the semiconductor devices over the chip (die) areas 2, and to form fill areas 12B over the kerf areas 4. For example, the conducting layer is typically a doped polysilicon, which is deposited by low-pressure chemical vapor deposition (LPCVD) using silane ($SiH_4$) as the reactant gas. The polysilicon is deposited to a preferred thickness of between about 2000 and 5000 Angstroms, and is typically doped N or $P+$ to meet the device requirements. For example, the polysilicon conducting layer is used to make FET gate electrodes and local interconnections. Alternatively, the conducting layer can be a polycide layer (polysilicon/refractory metal silicide) to improve electrical conductivity and device performance.

Still referring to FIG. 7, a photoresist mask (not shown) is used to pattern the conducting layer to form the portions 12A of the semiconductor devices in the die areas 2 and a patterned fill layer 12B in the kerf areas 4. Preferably the spacing S between the patterned conducting layer 12A on the die area 2 and the patterned fill layer 12B on the kerf area 4 is not greater than about 2.0 um. The actual size of the die areas is not critical to the invention, but is typically about 20 millimeters (mm). Next, a spin-on-glass layer 16, consisting of one of the silicon-oxide (Si-O) network polymers dissolved in an organic solvent, is deposited on the substrate by spin coating. More specifically, preferably the spin-on glass is siloxane-based spin-on glass, such as Accuglass 214, manufactured by Allied Chemical of U.S.A. Typically before depositing the spin-on glass layer 16, a thin cap layer, composed of a silicon oxide and deposited by LPCVD, for example, using tetraethosiloxane (TEOS), is used to prevent the underlying layer 12A–B from being contaminated. This thin cap oxide layer is not shown in the Figs. The spin-on-glass layer 16 is deposited sufficiently thick to fill the spacing S between the patterned conducting layer 12A and the fill layer 12B, and to form an essentially planar surface over the spacing S. Over a first conducting layer, the preferred thickness of the SOG 16 is between about 3000 and 6000 Angstroms.

The patterned conducting fill layer 12B in the kerf areas 4 under the SOG layer 16 results in a uniform coating of the SOG over the corners of the array of die areas 2 without buildup of the spin-on glass.

Continuing with FIG. 7, the spin-on-glass layer 16 is then baked to drive off the solvents, and cured to form an essentially $SiO_x$ layer. Typically, the SOG is baked at a temperature of between about 350 and 450° C. for a time of between about 60 and 90 minutes. The SOG layer 16 can now be chemically-mechanically polished back, if required, to further planarize the surface. The underlying patterned fill layer 12B also prevents dishing of the spin-on glass 16 in the kerf areas 4 when chem-mech polishing is carried out. An insulating layer 20 is deposited on the spin-on-glass layer 16 to complete the insulation for the conducting layer 12. Insulating layer 20 serves as an encapsulating layer to prevent contamination of the next conducting layer that will be deposited. Insulating layer 20 is preferably a silicon oxide, deposited by LPCVD, to a thickness of between about 4000 and 8000 Angstroms.

Figure 8:
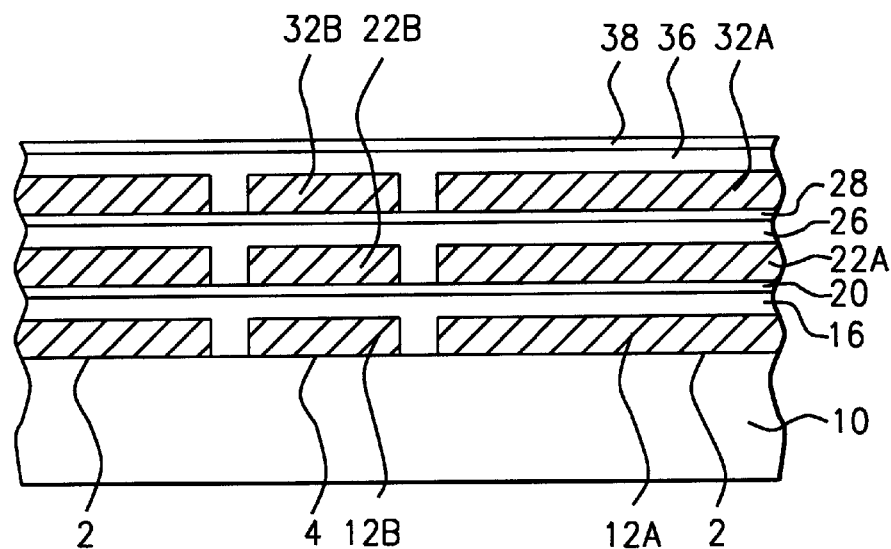
FIG. 8 is a schematic cross-sectional view through the area 7-7' of FIG. 6 depicting the planar structure for three levels of conducting layers.

Referring to FIG. 8, the process steps can be repeated for each additional patterned conducting layer required to complete the integrated circuit. As shown in FIG. 8, a second conductive layer 22 is deposited and patterned on the insulating layer 20 to form a second level of electrical interconnections 22A in the die areas 2, and to form a second patterned fill layer 22B in the kerf areas 4. Preferably the second conducting layer is a metal, such as aluminum or aluminum/copper, deposited, for example, by physical vapor deposition (sputtering) to a thickness of between about 6000 and 10000 Angstroms. A cap layer (not shown) and a second SOG layer 26 are deposited, while the patterned fill layer 22B over the kerf areas 4 serves to provide a uniformly planar surface during spin coating of the SOG. After curing the SOG layer 26, a second insulating layer 28, such as $SiO_x$, is deposited to prevent contamination of the next level of metallization. As shown in FIG. 8, the process is repeated a third time to form a third level of electrical interconnections using a patterned conducting layer 32A in the die areas 2, and to form a patterned fill layer 32B in the kerf areas 4, followed by a spin-on glass layer 26, which is cured, and by a third insulating layer 38, such as a LPCVD SiO$_x$. The thicknesses of the various layers are determined according to circuit requirements.

Although the structure in FIG. 8 is shown for three levels of interconnections, the method can be applied to additional levels as required to complete the integrated circuit.

Although the method is generally applicable for making semiconductor integrated circuits, it is particularly useful for making liquid crystal displays (LCD). The planar spin-on-glass layer at the edge of the LCD die areas prevents optical distortion from the pixels at the edge of the die areas.

While the invention has been particularly shown and described with reference to the preferred embodiment thereof, it will be understood by those skilled in the art that various changes in form and detail may be made without departing from the spirit and scope of the invention.

What is claimed is:

1. A method for making an integrated circuit using a patterned fill layer in kerf areas for more uniformly level process layers comprising the steps of:

providing a semiconductor substrate having an array of die areas for semiconductor devices, said array of die areas separated by said kerf areas;

(a) depositing a conducting layer on said substrate;

(b) patterning said conducting layer to form portions of said semiconductor devices in said die areas, and concurrently patterning said conducting layer in said kerf areas to form said patterned fill layer;

(c) depositing a spin-on-glass layer on said patterned conducting layer, wherein said patterned fill layer in said kerf areas provides a uniform coating over corners of said array of die areas without buildup of said spin-on-glass;

(d) curing said spin-on-glass layer;

(e) chemical-mechanical polishing back said spin-on-glass layer, wherein said fill layer prevents dishing in said kerf areas;

(f) depositing an insulating layer on said spin-on-glass layer;

(g) repeating steps (a) through (f) for each additional patterned conducting layer required to complete said integrated circuit.

2. The method of claim 1, wherein said conducting layer is a metal.

3. The method of claim 2, wherein said metal is aluminum deposited to a thickness of between about 5000 and 6000 Angstroms.

4. The method of claim 1, wherein spacing between said patterned fill layers and said die areas is not greater than about 2 micrometers.

5. The method of claim 1, wherein said kerf areas have a width of between about 120 and 600 micrometers between said die areas.

6. The method of claim 1, wherein said spin-on-glass layer is spin coated to a thickness of between about 3000 and 6000 Angstroms.

7. The method of claim 1, wherein said insulating layer is silicon oxide and is deposited by plasma enhanced chemical vapor deposition to a thickness of between about 4000 and 8000 Angstroms.

8. The method of claim 1, wherein said insulating layer is a borophosphosilicate glass deposited by plasma enhanced chemical vapor deposition to a thickness of between about 4000 and 8000 Angstroms.

9. A method for making an integrated circuit using a patterned fill layer in kerf areas for more uniformly level process layers comprising the steps of:

providing a semiconductor substrate having an array of die areas for semiconductor devices, said array of die areas separated by said kerf areas;

(a) depositing a conducting layer on said substrate;

(b) patterning said conducting layer to form portions of said semiconductor devices in said die areas, and concurrently patterning said conducting layer in said kerf areas to form said patterned fill layer, wherein the space between said patterned fill layer and said die areas is not greater than 2 micrometers;

(c) depositing a spin-on-glass layer on said patterned conducting layer, wherein said patterned fill layer in said kerf areas provides a uniform coating over corners of said array of die areas without buildup of said spin-on-glass;

(d) curing said spin-on-glass layer;

(e) chemical-mechanical polishing back said spin-on-glass layer, wherein said fill layer prevents dishing in said kerf areas;

(f) depositing an insulating layer on said spin-on-glass layer;

(g) repeating steps (a) through (f) for each additional patterned conducting layer required to complete said integrated circuit.

10. The method of claim 9, wherein said conducting layer is a metal.

11. The method of claim 10, wherein said metal is aluminum deposited to a thickness of between about 6000 and 10000 Angstroms.

12. The method of claim 9, wherein said conducting layer is a polycide layer.

13. The method of claim 9, wherein said kerf areas have a width of between about 120 and 600 micrometers between said die areas.

14. The method of claim 9, wherein said spin-on-glass layer is spin coated to a thickness of between about 3000 and 6000 Angstroms.

15. The method of claim 9, wherein said insulating layer is silicon oxide and is deposited by plasma enhanced chemical vapor deposition to a thickness of between about 4000 and 8000 Angstroms.

16. The method of claim 9, wherein said insulating layer is a borophosphosilicate glass deposited by plasma enhanced chemical vapor deposition to a thickness of between about 4000 and 8000 Angstroms.

17. The method of claim 9, wherein said integrated circuit is used to form a portion of a liquid crystal display.

* * * * *